(12) United States Patent
Chen et al.

(10) Patent No.: US 11,729,937 B2
(45) Date of Patent: Aug. 15, 2023

(54) ENVIRONMENT DETECTING MODULE

(71) Applicant: Wiwynn Corporation, New Taipei (TW)

(72) Inventors: Yi-Hao Chen, New Taipei (TW); Cheng-Kuang Hsieh, New Taipei (TW); Yung-Ti Chung, New Taipei (TW); Jheng-Ying Jiang, New Taipei (TW)

(73) Assignee: Wiwynn Corporation, New Taipei (TW)

(*) Notice: Subject to any disclaimer, the term of this patent is extended or adjusted under 35 U.S.C. 154(b) by 197 days.

(21) Appl. No.: 17/486,904

(22) Filed: Sep. 27, 2021

(65) Prior Publication Data

US 2023/0014174 A1    Jan. 19, 2023

(30) Foreign Application Priority Data

Jul. 14, 2021   (TW) ................................. 110125907

(51) Int. Cl.
| | |
|---|---|
| *G06F 1/16* | (2006.01) |
| *H05K 5/00* | (2006.01) |
| *H05K 7/00* | (2006.01) |
| *H05K 7/14* | (2006.01) |
| *H05K 7/20* | (2006.01) |

(52) U.S. Cl.
CPC ......... *H05K 7/1494* (2013.01); *H05K 7/1492* (2013.01); *H05K 7/20836* (2013.01)

(58) Field of Classification Search
CPC . H05K 7/1494; H05K 7/1492; H05K 7/20836
See application file for complete search history.

(56) References Cited

U.S. PATENT DOCUMENTS

| | | | |
|---|---|---|---|
| 6,195,243 B1* | 2/2001 | Spencer | H02H 3/04 361/96 |
| 10,541,099 B1* | 1/2020 | Gardner | G06F 1/3212 |
| 2014/0177738 A1* | 6/2014 | Alshinnawi | H02J 13/00017 375/257 |
| 2015/0207301 A1* | 7/2015 | Franks | H02H 3/162 361/634 |
| 2017/0125195 A1* | 5/2017 | Sisley | G01R 21/007 |
| 2018/0284169 A1* | 10/2018 | Kwan | H02J 3/14 |
| 2020/0311003 A1* | 10/2020 | Zimmermann | H04L 41/0893 |
| 2022/0283976 A1* | 9/2022 | Long | G06F 1/26 |

* cited by examiner

*Primary Examiner* — Anthony M Haughton
(74) *Attorney, Agent, or Firm* — Winston Hsu

(57) ABSTRACT

An environment detecting module, for securing a shell of a server, includes a sensing module, configured to sense an environment status by a polling method and generate a sensing signal according to the environment status; a connection module, configured to electrically connect the environment detecting module to a host terminal with a first connection status or a second connection status; and a microcontroller unit, coupled to the sensing module and the connection module, configured to determine a power source of the environment detecting module according to the first connection status or the second connection status, and to determine a first mode or a second mode of the environment detecting module according to the power source.

20 Claims, 3 Drawing Sheets

ENVIRONMENT DETECTING MODULE

BACKGROUND OF THE INVENTION

1. Field of the Invention

The present invention relates to an environment detecting module, and more particularly, to an environment detecting module capable of monitoring the environment of a server in a data center rack.

2. Description of the Prior Art

With the advancement of 5th generation (5G) technology, data centers can be on-premise to achieve lower latency, i.e. at least part of the data center is housed in the facilities of a particular enterprise or implemented by a relay machine room with edge computing. An operation environment of the servers of the data center, however, and the temperature, humidity, vibration etc., cannot easily be monitored or managed by the server suppliers. Further, in order to manage the data center hardware, the supplier needs to repair the system and replace elements with authorization. Therefore, it is difficult to maintain or manage the safety of the on-premise system.

In addition, conventional vibration detection utilizes shock labels adhered to server rack for detecting vibration to the server during shipment or transport. These shock labels can only obtain the force status of the rack in which the server is housed, and cannot obtain the status of the server itself, or the timing of the force and the force intensity.

Therefore, improvements are necessary to the conventional techniques.

SUMMARY OF THE INVENTION

In light of this, the present invention provides an environment detecting module which can monitor the status of the server both during operational processes and non-operational processes.

An embodiment of the present invention discloses an environment detecting module for securing a shell of a server. The environment detecting module comprises: a sensing module, configured to sense an environment status by a polling method and generate a sensing signal according to the environment status; a connection module, configured to electrically connect the environment detecting module to a host terminal with a first connection status or a second connection status; and a microcontroller unit, coupled to the sensing module and the connection module, configured to determine a power source of the environment detecting module according to the first connection status or the second connection status, and to determine a first mode or a second mode of the environment detecting module according to the power source.

Another embodiment of the present invention discloses an environment detecting module for securing a shell of a server. The environment detecting module comprises: a sensing module, configured to sense an environment status by a polling method, and generate a sensing signal according to the environment status; a connection module, configured to electrically connect the environment detecting module to a host terminal with a first connection status or a second connection status; and a microcontroller unit, coupled to the sensing module and the connection module, configured to determine a power source of the environment detecting module according to the first connection status or the second connection status, and to determine a first mode or a second mode of the environment detecting module according to the power source, wherein the microcontroller unit includes a volatile memory, such that a key is written into the volatile memory when the environment detecting module is powered-on, and the key is dissolved when the environment detecting module is powered-off.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
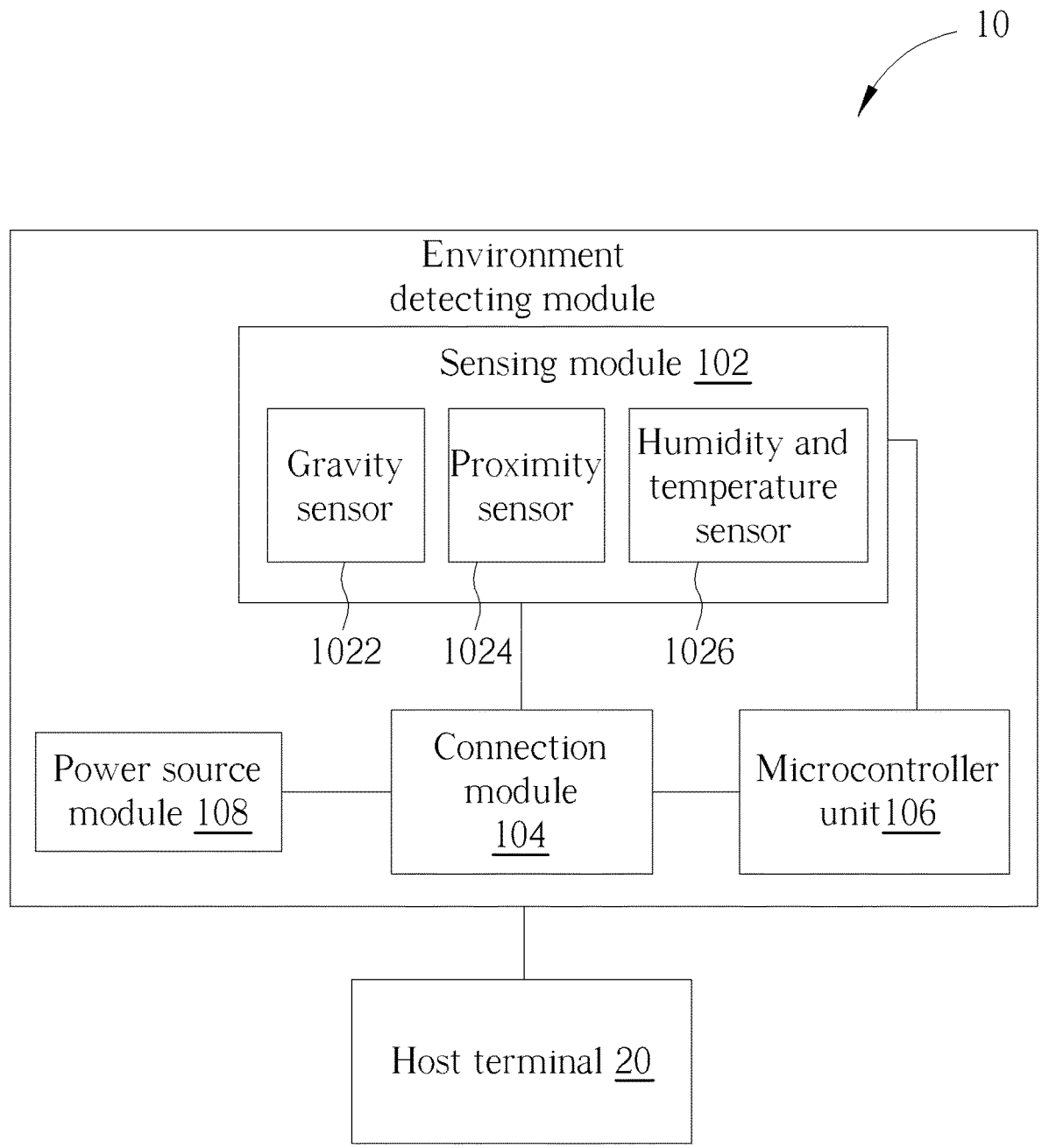
FIG. 1 is a schematic diagram of an environment detecting module according to an embodiment of the present invention.

Refer to FIG. 1, which is a schematic diagram of an environment detecting module 10 according to an embodiment of the present invention. The environment detecting module 10 may be applied to a server disposed in a rack located in a data center, and be for securing a shell of the server. For example, the environment detecting module 10 may be a screw for securing the shell of the server, and is electrically connected to a baseboard management controller (BMC) of the server for transmitting data and power. In another embodiment, the environment detecting module 10 may be other elements for securing the server that can electrically connect to a host terminal 20 of the server. The environment detecting module 10 includes a sensing module 102, a connection module 104, a microcontroller unit 106 and a power source module 108. The sensing module 102 may include a gravity sensor 1022, a proximity sensor 1024, and a humidity and temperature sensor 1026, and sense an environment status by a polling method to generate a sensing signal according to the environment status. The connection module 104 is configured to electrically connect the environment detecting module 10 to the host terminal 20 with a first connection status or a second connection status. For example, the connection module 104 may use different combinations of circuit wires to implement different connection statuses. Alternatively, the connection module 104 may be composed of pins with different lengths to implement the different connection statuses. The microcontroller unit 106 is coupled to the sensing module 102 and the connection module 104, and is configured to determine a power source of the environment detecting module 10 according to the first connection status or the second connection status, and to determine a first mode or a second mode of the environment detecting module 10 according to the power source. In an embodiment, the sensing signal may be values or data sensed by the sensors, wherein the first mode may be a power-on mode and the second mode may be a power-off mode. That is, when the environment detecting module 10 is in the first mode (i.e. the power-on mode), the environment detecting module 10 is electrically connected to the host terminal 20, and the power source is provided by the host terminal 20; when the environment detecting module 10 is in the second mode (i.e. the power-off mode), the power source of the environment detecting module 10 is provided by the power source module 108. The power source module 108 may be a real-time clock (RTC) circuit of the microcontroller unit 106 or an independent battery circuit of the environment detecting module 10, which is the power source when the environment detecting module 10 is in the second mode (i.e. the power-off mode). Therefore, the environment detecting module 10 according to an embodiment of the present invention may monitor status of the server of both operational processes and non-operational processes when applied on the server.

In detail, the gravity sensor 1022 of the sensing module 102 is configured to sense a variation in gravity of the environment detecting module 10. When the environment detecting module 10 encounters a vibration event, the microcontroller unit 106 is triggered to store data associated with the vibration event into a non-volatile memory (NVM) of the microcontroller unit 106. The proximity sensor 1024 of the sensing module 102 is configured to sense distances between the server and its surrounding objects. The humidity and temperature sensor 1026 of the sensing module 102 is configured to sense a humidity and temperature of an environment where the server is located.

More specifically, when the environment detecting module 10 is in the first mode (i.e. the power-on mode), the gravity sensor 1022, the proximity sensor 1024, the humidity and temperature sensor 1026 of the sensing module 102 and the microcontroller unit 106 are all activated to perform real-time monitoring, such that the microcontroller unit 106 may read or receive the data of each sensor of the sensing module 102 and check whether the data of each sensor is abnormal. When the data (or value) of any sensor is abnormal, e.g. a value sensed by the sensor is higher than a predetermined value, the microcontroller unit 106 is configured to transmit a warning signal referring to the abnormal value to the host terminal 20, and write the abnormal value and timing into the NVM of the microcontroller unit 106, such that the host terminal 20 may read related data from the NVM. In the first mode (i.e. the power-on mode), the gravity sensor 1022, the proximity sensor 1024, and the humidity and temperature sensor 1026 of the sensing module 102 are all turned on to detect the environment status of the server. In an example, when the humidity and temperature sensor 1026 senses that a temperature of the environment status of the environment detecting module 10 is higher than 40 degree Celsius and the microcontroller unit 106 reads the data (i.e. 40 degree Celsius), the microcontroller unit 106 transmits the warning signal to the host terminal 20 and writes the abnormal value and timing into the NVM of the microcontroller unit 106.

When the environment detecting module 10 is in the second mode (i.e. the power-off mode), the power source of the environment detecting module 10 is provided by the power source module 108. The environment detecting module 10 may monitor status during transport of the rack carrying the server, e.g. tilt, strike or vibration. More specifically, referring to the power consumption issue, when in the second mode (i.e. the power-off mode), only the gravity sensor 1022 of the environment detecting module 10 is turned on, such that when the gravity sensor 1022 detects that the gravity status is abnormal, the gravity sensor 1022 may trigger the microcontroller unit 106 to record and store an acceleration data associated with the server to the NVM of the microcontroller unit 106. When the microcontroller unit 106 finishes writing the acceleration data associated with the server, the microcontroller unit 106 is configured to reset the gravity sensor 1022 and then the microcontroller unit 106 is turned off. Notably, when in the second mode (i.e. the power-off mode), the microcontroller unit 106 is turned on when triggered by the gravity sensor 1022, and the microcontroller unit 106 is turned off when finishing writing the acceleration data associated with the server to reduce the power consumption of the environment detecting module 10. Therefore, an operation duration of the environment detecting module 10 according to an embodiment of the present invention may last one to two years under the second mode (i.e. the power-off mode).

When the environment detecting module 10 according to an embodiment of the present invention is integrated with the shell screw of the server, the screw is secured into the shell of the server to electrically connect to the host terminal 20. In this case, the connection module 104 of the environment detecting module 10 according to an embodiment of the present invention is electrically connected to the host terminal 20 with the first connection status, and the power source of the environment detecting module 10 is provided by the host terminal 20 (i.e. the BMC of the host terminal 20 may provide the power source for the environment detecting module 10) for testing functions of the environment detecting module 10. Notably, the power source module 108 of the environment detecting module 10 is not activated in this case.

On the other hand, when the connection module 104 is electrically connected to the host terminal 20 in the second connection status, the power source of the environment detecting module 10 is provided by the power source module 108. In an embodiment, the microcontroller unit 106 may further include a volatile memory, such that the microcontroller unit 106 may write a key into a volatile memory when the connection module 104 is electrically connected to the host terminal 20 in the second connection status, wherein the key may be an on-premise key. In order to prevent the shell of the server from intrusion or attack, the key written into the volatile memory is dissolved when the environment detecting module 10 is powered-off. It can be known that the server has undergone attempted intrusion when the host terminal 20 of the server fails to verify the key. In an example, the key is owned by a supplier, and thus when performing chassis intrusion for the server, the on-premise key of the environment detecting module 10 according to an embodiment of the present invention is utilized for protecting the hardware safety of the server.

The first connection status and the second connection status between the connection module 104 and the host terminal 20 may be different combination sets of circuit wires to implement different connection statuses. In addition, when the environment detecting module 10 is the screw, the first connection status and the second connection status may respectively correspond to the connection statuses of the screw at different positions on the shell of the server. In an embodiment, the connection module 104 may connect to the BMC of the host terminal 20 with a first circuit wire and a second circuit wire, such that when the screw (i.e. the environment detecting module 10) is screwed at a first position, only the first circuit wire is conductive, and the connection module 104 and the host terminal 20 have the first connection status. When the screw (i.e. the environment detecting module 10) is screwed at a second position, the first circuit wire and the second circuit wire are both conductive, and the connection module 104 and the host terminal 20 are connected with the second connection status. In another embodiment, the connection module 104 may be pins with different length, which implement different connection statuses by conducting different numbers of pins. Therefore, the environment detecting module 10 according to an embodiment of the present invention may perform different monitoring measurements according to the connection status with the host terminal 20.

Figure 2:
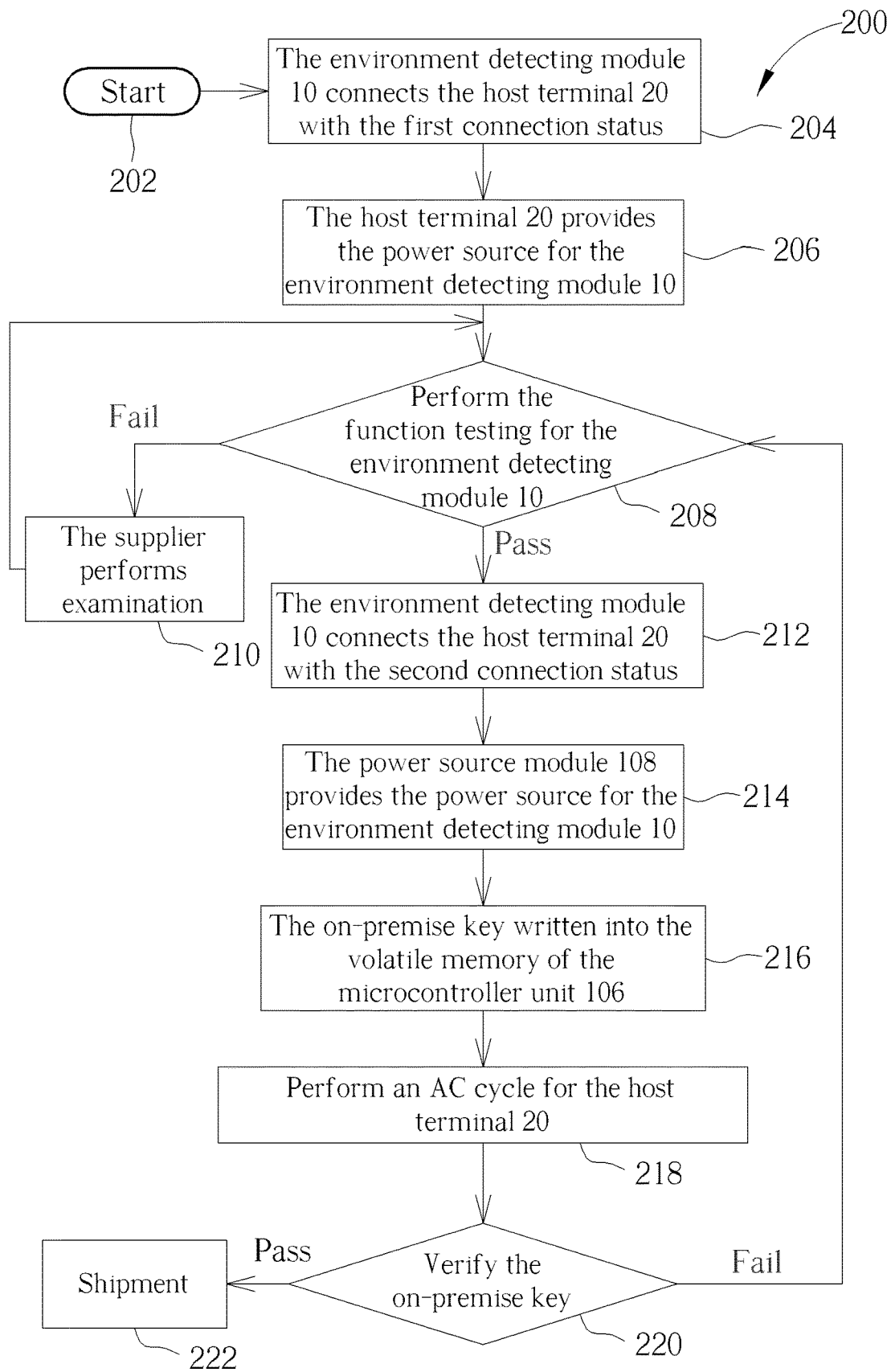
FIG. 2 is a schematic diagram of an examination method according to an embodiment of the present invention.

An examination method of the environment detecting module 10 may be illustrated by an examination method 200, as shown in FIG. 2. The examination method 200 includes the following steps:

Step 202: Start;

Step 204: The environment detecting module 10 connects the host terminal 20 with the first connection status;

Step 206: The host terminal 20 provides the power source for the environment detecting module 10;

Step 208: Perform the function testing for the environment detecting module 10. If function testing passes, go to step 212; if function testing fails, go to step 210;

Step 210: The supplier performs examination;

Step 212: The environment detecting module 10 connects the host terminal 20 with the second connection status;

Step 214: The power source module 108 provides the power source for the environment detecting module 10;

Step 216: The on-premise key written into the volatile memory of the microcontroller unit 106;

Step 218: Perform an AC cycle for the host terminal 20;

Step 220: Verify the on-premise key. If the on-premise key passes, go to step 222; if the on-premise key fails, go to step 210;

Step 222: Shipment.

According to the examination method 200, the environment detecting module 10 according to an embodiment of the present invention may write the on-premise key into the environment detecting module 10 before the shipment, and perform the function testing to ensure normal operation of the server.

Figure 3:
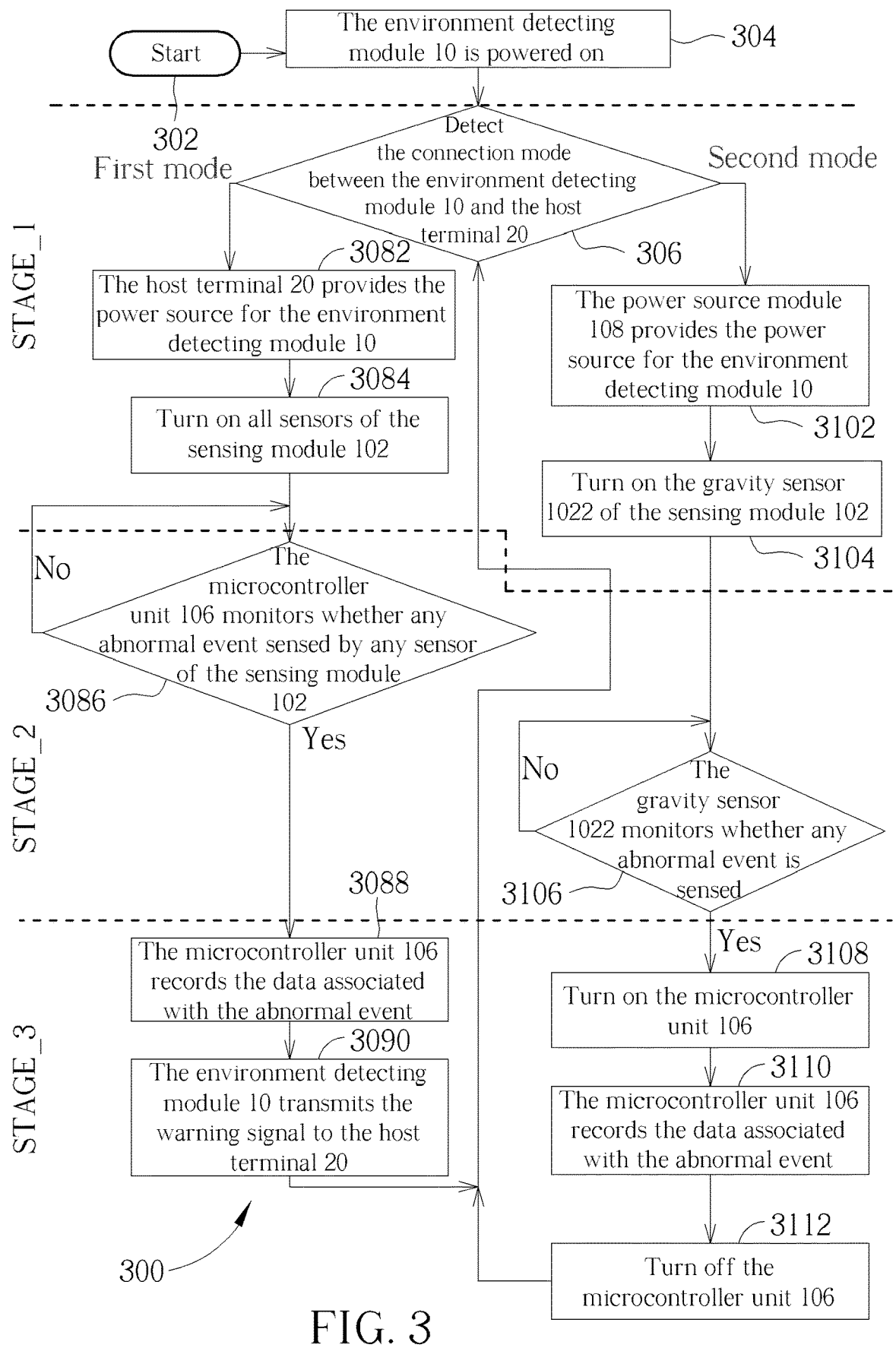
FIG. 3 is a schematic diagram of an environment monitoring method according to an embodiment of the present invention.

An operation method of the environment detecting module 10 may also be represented by an environment monitoring method 300, as shown in FIG. 3. The environment monitoring method 300 may include a mode detection stage Stage_1, a monitoring stage Stage_2 and a recording stage Stage_3, and the environment monitoring method 300 includes the following steps:

Step 302: Start;

Step 304: The environment detecting module 10 is powered on;

Step 306: Detect the connection mode between the environment detecting module 10 and the host terminal 20. If the connection mode is the first mode, go to step 3082; if the connection mode is the second mode, go to step 3102;

Step 3082: The host terminal 20 provides the power source for the environment detecting module 10;

Step 3084: Turn on all sensors of the sensing module 102;

Step 3086: The microcontroller unit 106 monitors whether any abnormal event sensed by any sensor of the sensing module 102. If yes, go to step 3088; if no, go to step 3086;

Step 3088: The microcontroller unit 106 records the data associated with the abnormal event;

Step 3090: The environment detecting module 10 transmits the warning signal to the host terminal 20;

Step 3102: The power source module 108 provides the power source for the environment detecting module 10;

Step 3104: Turn on the gravity sensor 1022 of the sensing module 102;

Step 3106: The gravity sensor 1022 monitors whether any abnormal event is sensed. If yes, go to step 3108; if no, go to step 3106;

Step 3108: Turn on the microcontroller unit 106;

Step 3110: The microcontroller unit 106 records the data associated with the abnormal event;

Step 3112: Turn off the microcontroller unit 106.

According to the environment monitoring method 300, in the mode detection stage Stage_1, the environment detecting module 10 according to an embodiment of the present invention may determine the power source according to an enable signal of a pin of the connection module 104 of the environment detecting module 10. For example, when the detected enable signal of the pin is 1, the environment detecting module 10 is in the first mode (i.e. the power-on mode) and the method goes to step 3082; in contrast, when the detected enable signal of the pin is 0, the environment detecting module 10 is in the second mode (i.e. the power-off mode) and the method goes to step 3102. Then, the environment detecting module 10 turns on all sensors of the sensing module 102 (i.e. step 3084) when in the first mode (i.e. the power-on mode), and the environment detecting module 10 turns on the gravity sensor 1022 of the sensing module 102 (i.e. step 3104) in the second mode (i.e. the power-off mode).

In the monitoring stage Stage_2, the microcontroller unit 106 monitors whether any sensor of the sensing module 102 senses any abnormal event or not (i.e. step 3086) when in the first mode (i.e. the power-on mode) of the environment detecting module 10. The microcontroller unit 106 records the data associated with the abnormal event when the abnormal event is detected (i.e. step 3088), and then transmits the warning signal to the host terminal 20 (i.e. step 3090).

In comparison, when the environment detecting module 10 is in the second mode (i.e. the power-off mode), the gravity sensor 1022 may monitor whether any abnormal event is sensed (i.e. step 3106), the microcontroller unit 106 is turned on when the abnormal event is sensed (i.e. step 3108) and the microcontroller unit 106 records the data associated with the abnormal event (i.e. step 3110). After the microcontroller unit 106 records the data associated with the abnormal event, and the microcontroller unit 106 is turned off (i.e. step 3112) to reduce the power consumption of the environment detecting module 10.

Notably, the environment detecting module 10 may be applied to chassis intrusion detection when the environment detecting module 10 is in the first mode (i.e. the power-on mode) to avoid maintenance or prevent changing elements of the server off-site, which ensures the safety of the server. When the environment detecting module 10 is in the second mode (i.e. the power-off mode), the environment detecting module 10 may be utilized for detecting vibration during shipment, which senses whether the environment detecting module 10 encounters tilt, strike or vibration by the gravity sensor 1022.

In summary, the present invention provides an environment detecting module, which is integrated with a screw of a shell of a server to effectively monitor environmental parameters and protect the system safety by integrating with the chassis intrusion detection.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An environment detecting module, for securing a shell of a server, comprising:

a sensing module, configured to sense an environment status by a polling method, and generate a sensing signal according to the environment status;

a connection module, configured to electrically connect the environment detecting module to a host terminal with a first connection status or a second connection status; and a microcontroller unit, coupled to the sensing module and the connection module, configured to determine a power source of the environment detecting module according to the first connection status or the second connection status, and to determine a first mode or a second mode of the environment detecting module according to the power source.

2. The environment detecting module of claim 1, wherein the sensing module comprises:

a gravity sensor, configured to sense a gravity variation of the environment detecting module;

a proximity sensor, configured to sense a distance between the server and surrounding objects; and a humidity and temperature sensor, configured to sense a humidity and temperature of the environment where the server is located.

3. The environment detecting module of claim 2, wherein when the environment detecting module is in the first mode, a power source of the environment detecting module is provided by the host terminal.

4. The environment detecting module of claim 3, wherein when the environment detecting module is in the first mode, the gravity sensor, the proximity sensor and the humidity and temperature sensor of the sensing module are all turned on to sense the environment status of the environment detecting module, such that the microcontroller unit is configured to record and store corresponding data to a non-volatile memory (NVM) of the microcontroller unit when the environment status is abnormal.

5. The environment detecting module of claim 2, further comprising:

a power source module, configured to provide a power source for the environment detecting module when the environment detecting module is in the second mode.

6. The environment detecting module of claim 5, wherein the power source module is a real-time clock (RTC) circuit of the microcontroller unit or an independent battery circuit of the environment detecting module.

7. The environment detecting module of claim 5, wherein when the environment detecting module is in the second mode, only the gravity sensor of the sensing module is turned on, such that the microcontroller unit is triggered by the gravity sensor to record and store an acceleration data associated with the server to a non-volatile memory (NVM) of the microcontroller unit when the environment status is abnormal.

8. The environment detecting module of claim 7, wherein when the microcontroller unit finishes writing the acceleration data associated with the server, the microcontroller unit is configured to reset the gravity sensor.

9. The environment detecting module of claim 5, wherein when the connection module is electrically connected to the host terminal with the first connection status, a power source of the environment detecting module is provided by the host terminal; when the connection module is electrically connected to the host terminal with the second connection status, the power source of the environment detecting module is provided by the power source module.

10. The environment detecting module of claim 1, wherein a number of conducting wires of the electrical connection between the connection module and the host terminal of the first connection status is different from a number of conducting wires of the electrical connection between the connection module and the host terminal of the second connection status.

11. An environment detecting module, for securing a shell of a server, comprising:

a sensing module, configured to sense an environment status by a polling method, and generate a sensing signal according to the environment status;

a connection module, configured to electrically connect the environment detecting module to a host terminal with a first connection status or a second connection status; and a microcontroller unit, coupled to the sensing module and the connection module, configured to determine a power source of the environment detecting module according to the first connection status or the second connection status, and to determine a first mode or a second mode of the environment detecting module according to the power source, wherein the microcontroller unit includes a volatile memory, such that a key is written into the volatile memory when the environment detecting module is powered-on, and the key is dissolved when the environment detecting module is powered-off.

12. The environment detecting module of claim 11, wherein the sensing module comprising:

a gravity sensor, configured to sense a gravity variation of the environment detecting module;

a proximity sensor, configured to sense a distance between the server and surrounding objects; and a humidity and temperature sensor, configured to sense a humidity and temperature of the environment where the server is located.

13. The environment detecting module of claim 12, wherein when the environment detecting module is in the first mode, a power source of the environment detecting module is provided by the host terminal.

14. The environment detecting module of claim 13, wherein when the environment detecting module is in the first mode, the gravity sensor, the proximity sensor and the humidity and temperature sensor of the sensing module are all turned on to sense the environment status of the environment detecting module, such that the microcontroller unit is configured to record and store corresponding data to a non-volatile memory (NVM) of the microcontroller unit when the environment status is abnormal.

15. The environment detecting module of claim 12, further comprising:

a power source module, configured to provide a power source for the environment detecting module when the environment detecting module is in the second mode.

16. The environment detecting module of claim 15, wherein the power source module is a real-time clock (RTC) circuit of the microcontroller unit or an independent battery circuit of the environment detecting module.

17. The environment detecting module of claim 15, wherein when the environment detecting module is in the second mode, only the gravity sensor of the sensing module is turned on, such that the microcontroller unit is triggered by the gravity sensor to record and store an acceleration data associated with the server to a non-volatile memory (NVM) of the microcontroller unit when the environment status is abnormal.

18. The environment detecting module of claim 17, wherein when the microcontroller unit finishes writing the acceleration data associated with the server, the microcontroller unit is configured to reset the gravity sensor.

19. The environment detecting module of claim 15, wherein when the connection module is electrically connected to the host terminal with the first connection status, a power source of the environment detecting module is provided by the host terminal; when the connection module is electrically connected to the host terminal with the second connection status, the power source of the environment detecting module is provided by the power source module.

20. The environment detecting module of claim 11, wherein a number of conducting wires of the electrical connection between the connection module and the host terminal of the first connection status is different from a number of conducting wires of the electrical connection between the connection module and the host terminal of the second connection status.

\* \* \* \* \*